(12) United States Patent
Dumoulin et al.

(10) Patent No.: US 9,846,207 B2
(45) Date of Patent: Dec. 19, 2017

(54) ACOUSTIC NOISE REDUCING RF COIL FOR MAGNETIC RESONANCE IMAGING

(71) Applicant: Children's Hospital Medical Center, Cincinnati, OH (US)

(72) Inventors: Charles L. Dumoulin, Cincinnati, OH (US); Randy Giaquinto, Cincinnati, OH (US); Wolfgang Loew, Cincinnati, OH (US)

(73) Assignee: CHILDREN'S HOSPITAL MEDICAL CENTER, Cincinnati, OH (US)

( * ) Notice: Subject to any disclaimer, the term of this patent is extended or adjusted under 35 U.S.C. 154(b) by 555 days.

(21) Appl. No.: 14/397,754

(22) PCT Filed: Dec. 21, 2012

(86) PCT No.: PCT/US2012/071220
§ 371 (c)(1),
(2) Date: Oct. 29, 2014

(87) PCT Pub. No.: WO2013/165470
PCT Pub. Date: Nov. 7, 2013

(65) Prior Publication Data
US 2015/0102813 A1    Apr. 16, 2015

Related U.S. Application Data

(60) Provisional application No. 61/640,058, filed on Apr. 30, 2012.

(51) Int. Cl.
*G01R 33/34* (2006.01)
*G01R 33/385* (2006.01)
*G01R 33/28* (2006.01)

(52) U.S. Cl.
CPC ....... *G01R 33/34* (2013.01); *G01R 33/34007* (2013.01); *G01R 33/3852* (2013.01);
(Continued)

(58) Field of Classification Search
CPC .............. G01R 33/34; G01R 33/34007; G01R 33/3852; G01R 33/288; G01R 33/34046; G01R 33/34076
See application file for complete search history.

(56) References Cited

U.S. PATENT DOCUMENTS 5,235,283 A    8/1993  Lehne et al.
5,243,287 A *  9/1993  Hashoian ......... G01R 33/34076
                                                    324/318
(Continued)

FOREIGN PATENT DOCUMENTS

WO    2007/146978 A1    12/2007
WO    2009/031092 A1     3/2009

OTHER PUBLICATIONS

International Search Report and Written Opinion, dated Mar. 29, 2013, for PCT/US2012/071220 with in international filing date of Dec. 21, 2012, mailed from the USPTO receiving office of the PCT, Alexandria, VA, US.

(Continued)

*Primary Examiner* — G. M. Hyder
(74) *Attorney, Agent, or Firm* — Baker & Hostetler LLP

(57) ABSTRACT

An RF coil assembly for use in a Magnetic Resonance Imaging scanner incorporates sound absorbing material in its construction for the purpose of attenuating the sound perceived by a patient lying inside the RF coil. Unlike a conventional RF coil assembly in which rigid components are used to support the coil within the magnet bore, the quiet RF coil assembly is constructed without rigid support components. In one embodiment, open cell foam may be used to (Continued)

support the RF coil components and the entire assembly is wrapped in a. flexible cloth-like material.

25 Claims, 7 Drawing Sheets

(52) U.S. Cl.
CPC ...... *G01R 33/288* (2013.01); *G01R 33/34046* (2013.01); *G01R 33/34076* (2013.01)

(56) References Cited

U.S. PATENT DOCUMENTS

| | | | |
|---|---|---|---|
| 5,554,929 A | 9/1996 | Doty et al. | |
| 5,793,210 A | 8/1998 | Pla et al. | |
| 5,841,279 A * | 11/1998 | Hayashi | G01R 33/3854 324/318 |
| 6,043,653 A | 3/2000 | Takamori et al. | |
| 6,107,799 A | 8/2000 | Sellers et al. | |
| 6,157,276 A | 12/2000 | Hedeen et al. | |
| 6,414,489 B1 * | 7/2002 | Dean | G01R 33/3854 324/318 |
| 6,437,568 B1 | 8/2002 | Edelstein et al. | |
| 6,441,616 B1 | 8/2002 | Mansfield | |
| 6,564,900 B1 | 5/2003 | Dean et al. | |
| 6,667,619 B2 | 12/2003 | Westphal et al. | |
| 6,810,990 B2 | 11/2004 | Dean et al. | |
| 6,933,722 B2 | 8/2005 | Tsuda et al. | |
| 6,943,552 B2 | 9/2005 | Renz | |
| 6,954,068 B1 | 10/2005 | Takamori et al. | |
| 7,053,744 B2 | 5/2006 | Arz et al. | |
| 7,068,033 B2 | 6/2006 | Sellers et al. | |
| 7,309,988 B2 | 12/2007 | Sellers | |
| 7,501,828 B1 | 3/2009 | Wong et al. | |
| 7,671,593 B2 | 3/2010 | Goldhaber et al. | |
| 7,755,359 B2 | 7/2010 | Yamamizu et al. | |
| 8,022,706 B2 | 9/2011 | Ham et al. | |
| 8,035,375 B2 | 10/2011 | Atkins et al. | |
| 2001/0022515 A1 | 9/2001 | Yamashita et al. | |
| 2006/0001425 A1 * | 1/2006 | Weyers | G01R 33/422 324/318 |
| 2007/0079253 A1 | 4/2007 | Leussler | |
| 2007/0290686 A1 | 12/2007 | Goldhaber et al. | |
| 2008/0238424 A1 | 10/2008 | Possanzini | |
| 2008/0279433 A1 | 11/2008 | Brau et al. | |
| 2009/0146066 A1 | 6/2009 | Renz et al. | |
| 2011/0026801 A1 | 2/2011 | Dohata et al. | |
| 2011/0291656 A1 | 12/2011 | Maciejewski | |
| 2012/0161763 A1 | 6/2012 | Renz | |
| 2012/0229138 A1 | 9/2012 | Saha et al. | |
| 2012/0293173 A1 | 11/2012 | De Lima et al. | |
| 2012/0313643 A1 | 12/2012 | Edelstein et al. | |
| 2013/0043870 A1 | 2/2013 | De Lima et al. | |
| 2013/0048415 A1 | 2/2013 | De Lima | |
| 2013/0234713 A1 * | 9/2013 | Maciejewski | G01R 33/34007 324/321 |

OTHER PUBLICATIONS

European Patent Application No. 12875769.7; Extended Search Report; dated Feb. 8, 2016; 12 pages.

* cited by examiner

ACOUSTIC NOISE REDUCING RF COIL FOR MAGNETIC RESONANCE IMAGING

CROSS-REFERENCE TO RELATED APPLICATIONS

The present application is a national stage entry of PCT/US2012/071220, filed Dec. 21, 2012, which claims the benefit of U.S. Provisional Application No. 61/640,058, filed Apr. 30, 2012, which is hereby incorporated by reference in its entirety.

FIELD OF THE INVENTION

The present disclosure relates generally to hardware used in Magnetic Resonance (MR) imaging systems, and more particularly to systems and methods for constructing Radio Frequency (RF) coils which attenuate acoustic noise generated during MR scanning.

BACKGROUND

The following description includes information that may be useful in understanding the present subject matter. It is not an admission that any of the information provided herein is prior art or relevant to the presently claimed subject matter, or that any publication specifically or implicitly referenced is prior art.

Magnetic Resonance imaging (MRI) employs a strong magnetic field that is used to polarize the spin magnetization in a patients body. The spin magnetization that is most often used in MRI arises from the nuclei of hydrogen atoms within the body. Although the highest concentration of hydrogen atoms within the body is found in water molecules, other compounds found in the body (e.g. lipids, glucose, etc.) are present in sufficient concentration to provide a detectable MR spin magnetization.

When the hydrogen atoms of a patients body are introduced into the polarizing magnetic field, the spin magnetization of the hydrogen atom nuclei align in one of two states: with the magnetic field or against the magnetic field. These two states occupy slightly different energy levels in a quantum mechanical system. By convention, the lowest energy level is called the ground state. It should be noted that the population of nuclear spins in the ground state is slightly higher than that of the higher energy state resulting in a net magnetization of the macroscopic group of nuclei.

The energy difference between the two energy levels is directly proportional to the strength of the polarizing magnetic field. Thus, as the strength of the magnetic field is increased the energy difference between the two states increases. The energy differences associated with typical MRI systems correspond to electromagnetic waves in the radiofrequency range. The specific frequency associated with the difference is called the Larmor frequency (typically given in MHz) The constant of proportionality that defines the relationship between the polarizing field (typically given in Tesla) and the Larmor frequency is a natural constant called the gyromagnetic ratio. This constant is unique for each MR active element. For Magnetic Resonance Imaging systems used in medicine, polarizing magnetic field fields are typically between 0.5 and 3.0 Tesla. For hydrogen atoms, these polarizing magnetic field strengths result in Larmor frequencies between 21.3 and 127.8 MHz.

If the nuclear spin system immersed in a polarizing magnetic field is subjected to a rotating magnetic field at the Larmor frequency, the spin system will absorb energy and the distribution of nuclear spins in the two energy states will be disturbed. The duration of the rotating magnetic field used to change the distribution of nuclear spins in the two energy states is typically limited, and applied with a strength sufficient to nutate the net spin magnetization from the longitudinal axis (i.e. parallel with the applied polarizing magnetic field) to the transverse plane (i.e. perpendicular to the applied polarizing field). The term "RF pulse" is conventionally used to describe this process since nutation is accomplished with a rotating magnetic field in the radiofrequency range and having a finite duration.

With time, the energy will be emitted by the spin system in a fashion that can be detected with a sensitive pickup coil. This phenomenon is typically called "resonance". The absorption and RF emission of an RF signal is key to the formation of an MR image.

When an MR signal is created, the frequency of the signal is precisely proportional to the strength of the magnetic field experienced by the nuclear spins. If all of the spins in a patient's body are in an identical magnetic field, then all the spins will resonate with the same frequency. Even though signals come from many different portions of the body, the MR imaging system has no way to distinguish one signal from another.

In order to provide spatial encoding of the MR signals (and hence enable the formation of an image), it is useful to create a transient inhomogeneity in the magnetic field. In typical MRI imaging systems this is accomplished with magnetic field gradient coils. Gradient coils typically are designed to create a magnetic field whose strength varies in a linear fashion over a selected volume within the magnet. Gradient coil sets are typically constructed to permit gradient fields to be created in three orthogonal directions within the bore of the magnet. Typical gradient coils driven by typical gradient amplifiers can generate a magnetic field gradient of 20 mT/m in less than 1 ms, and maintain that gradient with high fidelity for an extended period limited only by the heat dissipation of the gradient coils and amplifier.

A typical imaging system creates an image by employing a sequence of RF and magnetic field gradient pulses to establish a detectable MR signal in a selected plane. This signal is then spatially encoded using magnetic field gradient pulses to impart phase and frequency shifts to the MR signal which reveal the location of the signal source within the bore of the magnet. By selecting pulse sequence repetition times (TR), echo times (TE) and other pulse sequence parameters the operator can tune the pulse sequence to be sensitive to a variety of intrinsic MR parameters found in the tissue of the patient (e.g. longitudinal relaxation time, T1, Transverse relaxation time, T2, and the like). Many pulse sequences are known to those skilled in the state of the art. These pulse sequences can collect data in two or three dimensions. They can also collect data in Cartesian, radial or spiral frameworks.

One aspect common to all MR imaging pulse sequences is that they employ transient magnetic field gradients. These transient gradient pulses are created by running electrical current through the gradient coils that are located within the bore of the magnet. Current running through these coils creates a mechanical force that results in a small physical displacement of the coil and its structure. Because of the temporal duration of these gradient pulses, acoustic noise is created. Despite aggressive engineering measures to minimize the amplitude of these physical displacements, MR imaging systems can be loud and hearing protection for the patient is required. The volume of acoustic noise created by a particular pulse sequence depends on many factors including the stiffness of the gradient coil construction, the strength of the various gradient pulses used in the imaging sequence, and the timing of the sequence. Acoustic noise levels in some MR scanners can be has high as 120 dBA.

In view of the foregoing it may be understood that the reduction of acoustic noise during MR scanning is desirable, and may serve to increase patient comfort and tolerance for scanning.

SUMMARY

Embodiments of the present disclosure provide a RF MR imaging coil whose construction also serves to attenuate acoustic noise created by the MRI system's gradient coils. In an embodiment, the RF MR imaging coil is a body coil which is permanently mounted in a large magnet and is made to be integral to the magnet assembly. In an alternate embodiment the RF MR imaging coil can be removable and exchangeable. Such an approach may be desirable in smaller magnets designed for orthopedic and/or neonatal MR imaging.

In an exemplary embodiment of the present invention, an RF excitation coil having a "birdcage" topology is constructed using foam substrates for mechanical support such that no rigid elements are used to connect the RF coil to the interior wall of the gradient system. The materials chosen for the substrate are intended to minimize the propagation of mechanical vibrations from the MR system's gradient coils to the bore of the imaging system where the patient is lying, thereby reducing the acoustic noise exposure to the patient. Birdcage coils can have: a "high-pass" topology in which capacitors are placed in the end-rings and the rungs are comprised of inductive elements, a "low-pass" topology in which the end rings have inductive elements and one or more capacitors are placed in the rungs, or a "band-pass" topology in which capacitors and inductors are found in both end rings and rungs.

In another exemplary embodiment, the RF excitation coil is used for both exciting and receiving the MR signals.

In another exemplary embodiment, both an RF shield and an RF coil are incorporated into an integrated assembly, with the RF shield placed around the excitation coil. In this configuration, the RF coil is mechanically decoupled from the RF shield by the foam substrate.

In another exemplary embodiment, the RF excitation coil has a Transverse Electro-Magnetic (TEM) topology. The TEM topology is similar to a birdcage topology, but incorporates discrete current return paths for each rung.

In another exemplary embodiment, a foam plug is used to substantially enclose one end of the RF coil. This plug serves to further reduce the acoustic noise while allowing the patient to enter the coil from the opposite end.

In another exemplary embodiment, one or more vibration isolation suspension members are used to support the weight of the RF coil inside the integrated coil assembly.

Support for invention will now be described in more detail with reference to exemplary embodiments thereof as shown in the accompanying drawings. While support for the invention is below with reference to exemplary embodiments, it should be understood that the scope of the invention is not limited thereto. Those of ordinary skill in the art having access to the teachings herein will recognize additional implementations, modifications, and embodiments, as well as other fields of use, which are within the scope of the invention as described herein, and with respect to Which the invention may be of significant utility.

BRIEF DESCRIPTION OF THE DRAWINGS

In order to facilitate a fuller understanding of the present invention, reference is now made to the accompanying drawings, in which like elements are referenced with like numerals. These drawings should not be construed as limiting the present invention, but are intended to be exemplary only.

In the drawings.

DETAILED DESCRIPTION

Embodiments of the present disclosure provide RF coils for use in Magnetic Resonance scanners which provide RF excitation and detection of MR signals while attenuating the acoustic noise generated by the scanner.

MR imaging of internal body tissues may be used for numerous medical procedures, including diagnosis and surgery. In general terms, MR imaging starts by placing a subject in a relatively uniform, static magnetic field. The static magnetic field causes hydrogen nuclei spins to align and precess about the general direction of the magnetic field. Radio frequency (RF) magnetic field pulses are then superimposed on the static magnetic field to cause some of the aligned spins to alternate between a temporary high-energy nonaligned state and the aligned state, thereby inducing an RF response signal, called the MR echo or MR response signal. It is known that different tissues in the subject produce different MR response signals, and this property can be used to create contrast in an MR image. An RF receiver detects the duration, strength, and source location of the MR response signals, and such data are then processed to generate tomographic or three-dimensional images.

Figure 1:
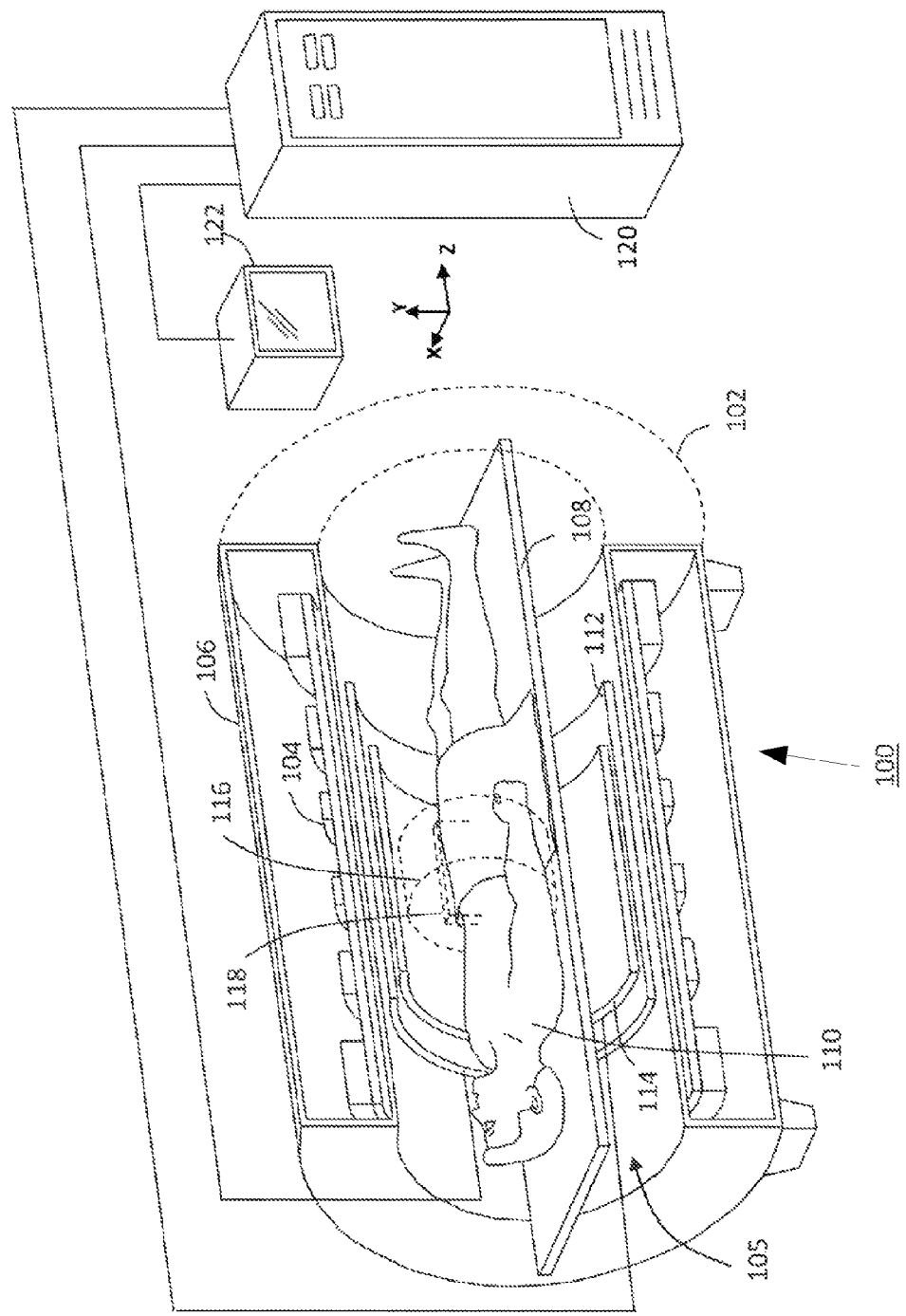
FIG. 1 shows an exemplary MRI system in or for which the present disclosure may be implemented.

FIG. 1 shows an exemplary MRI system 100 in or for which MR imaging in accordance with the present disclosure may be implemented. The illustrated MRI system 100 comprises an MRI magnet assembly 102. Since the components and operation of the MRI scanner are well-known in the art, only some basic components helpful in the understanding of the system 100 and its operation will be described herein.

The MRI magnet assembly 102 typically comprises a cylindrical superconducting magnet 104, which generates a static magnetic field within a bore 105 of the superconducting magnet 104. The superconducting magnet 104 generates a substantially homogeneous magnetic field within an imaging region 116 inside the magnet bore 105. The superconducting magnet 104 may be enclosed in a magnet housing 106. A support table 108, upon which a patient 110 lies, is disposed within the magnet bore 105. A region of interest 118 within the patient 110 may be identified and positioned within the imaging region 116 of the MRI magnet assembly 102.

A set of cylindrical magnetic field gradient coils 112 may also be provided within the magnet bore 105. The gradient coils 112 also surround the patient 110. The gradient coils 112 can generate magnetic field gradients of predetermined magnitudes, at predetermined times, and in three mutually orthogonal directions within the magnet bore 105. With the field gradients, different spatial locations can be associated with different precession frequencies, thereby giving an MR image its spatial resolution. An RF transmitter coil 114 surrounds the imaging region 116 and the region of interest 118. The RF transmitter coil 114 emits RF energy in the form of a rotating magnetic field into the imaging region 116, including into the region of interest 118.

The RF transmitter coil 114 can also receive MR response signals emitted from the region of interest 118. The MR response signals are amplified, conditioned and digitized into raw data using an image processing system 120, as is known by those of ordinary skill in the art. The image processing system 120 further processes the raw data using known computational methods, including fast Fourier transform (FFT), into an array of image data. The image data may then be displayed on a monitor 122, such as a computer CRT, LCD display or other suitable display.

Figure 2:
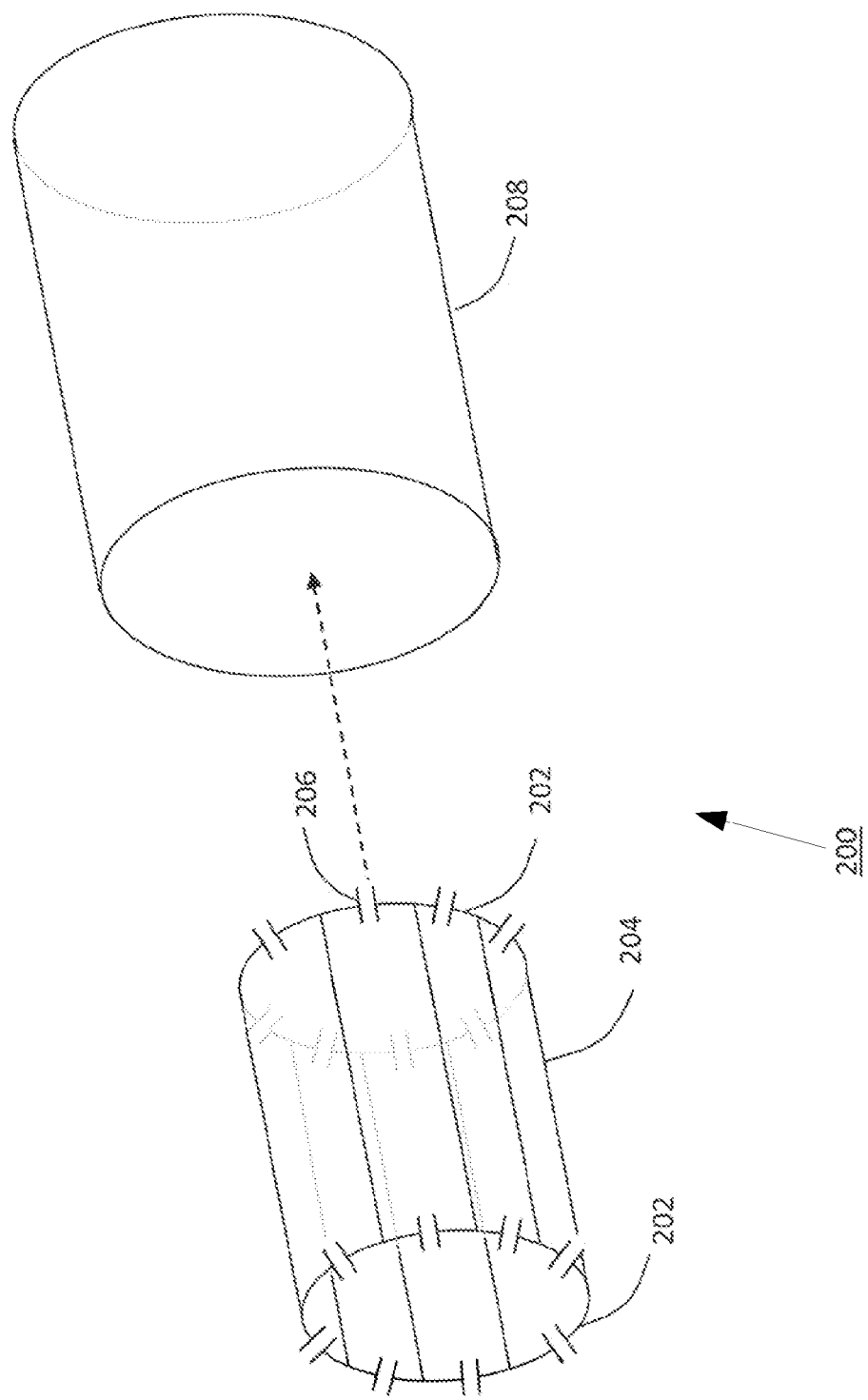
FIG. 2 shows an exemplary high-pass birdcage RF coil suitable for incorporation with an embodiment of the present disclosure.

FIG. 2 illustrates one embodiment of RF transmitter coil 114. This coil is a high-pass birdcage coil assembly 200 that is well known to those skilled in the art. The coil is comprised of a set of inductive rungs 204 that are connected to two end rings 202. Within each end ring 202 the electrical connection between each of the inductive rungs 204 incorporates a capacitive element 206. The inductance of inductive rungs 204 and the capacitance of capacitive elements 206 are chosen so that the high-pass birdcage coil assembly 200 resonates at the Larmor frequency of the MR scanner, and such that this resonant mode creates a rotating magnetic field in the center of the assembly. It is typically desirable to construct inductive rungs 204 so that each has substantially the same inductance, and to construct capacitive elements 206 so that each has substantially the same capacitance. This constancy among elements is typically needed to maximize the homogeneity of the rotating magnetic field.

FIG. 2 also shows the incorporation of an RF shield 208. This shield is an optional element of coil assembly 200. RF shield 208 serves to contain the electromagnetic fields generated by electrical currents flowing in the inductive rungs. An ideal RF shield 208 acts as a conductor at the Larmor frequency, while appearing to be non-conducting at the frequency of the gradient pulses created by the gradient coils 112. RF shield 208 can be constructed with a thin sheet of conducting material such as copper, a mesh, or it can have a slotted design to minimize gradient pulse-induced eddy currents. Note that if the RF transmitter coil 114 is small with respect to the magnet bore 105, RF shield 208 may not be required. This is commonly the case for birdcage head coils.

Figure 3:
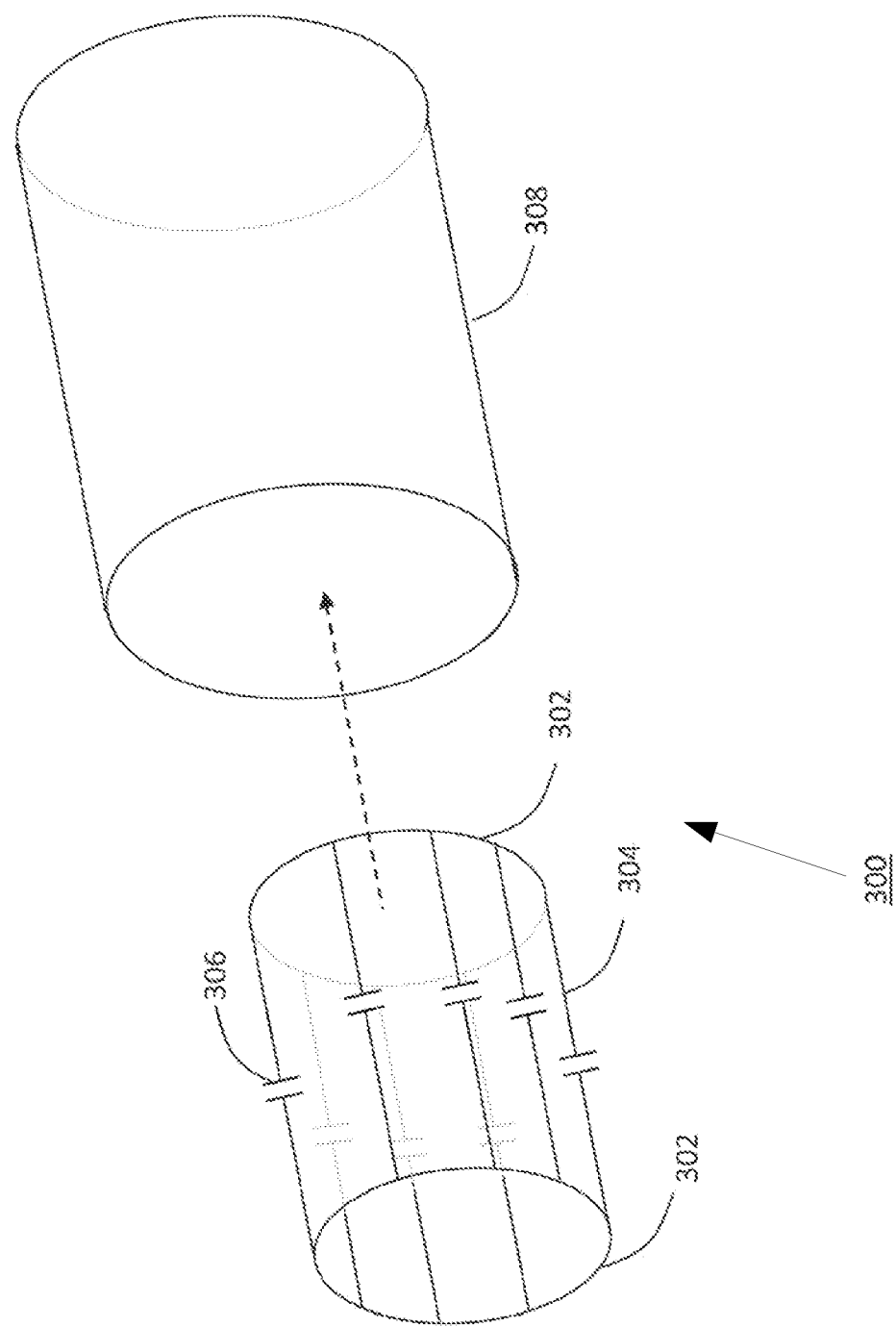
FIG. 3 shows an exemplary low-pass birdcage RF coil suitable for incorporation with an embodiment of the present disclosure.

FIG. 3 illustrates a second embodiment of RF transmitter coil 114. This coil is a low-pass birdcage coil assembly 300 that is well known to those skilled in the art. The coil is comprised of a set of rungs 304 that are connected to two end rings 302. Within each end ring 302 a direct electrical connection is made between each of the rungs 304. Each rung 304 incorporates a capacitive element 306. The inductance of the end rings 302 and the capacitance of capacitive elements 306 are chosen so that the low-pass birdcage coil assembly 300 resonates at the Larmor frequency of the MR scanner, and such that this resonant mode creates a rotating magnetic field in the center of the assembly. It is typically desirable to construct rungs 304 to be substantially the same, and to construct capacitive elements 306 so that each has substantially the same capacitance. This constancy among elements is typically needed to maximize the homogeneity of the rotating magnetic field.

FIG. 3 also shows the incorporation of an RF shield 308. This shield is an optional element of coil assembly 300 and serves the same purpose as RF shield 208 described in FIG. 2.

The construction of the RF coils shown in FIGS. 2 and 3 is that the RF coil is physically attached to the MRI magnet assembly 102. This attachment serves to position the RF transmitter coil 114 inside magnet bore 105. In prior art embodiments of RF transmitter coil 114, the attachment is accomplished using rigid elements that propagate vibrations from the gradient coils to the RF transmitter coil 114. These vibrations then propagate to the patient 110 and are perceived as acoustic noise. Acoustic noise is also propagated through the air space between the gradient coil and the inner bore of RF transmitter coil 114.

Figure 4:
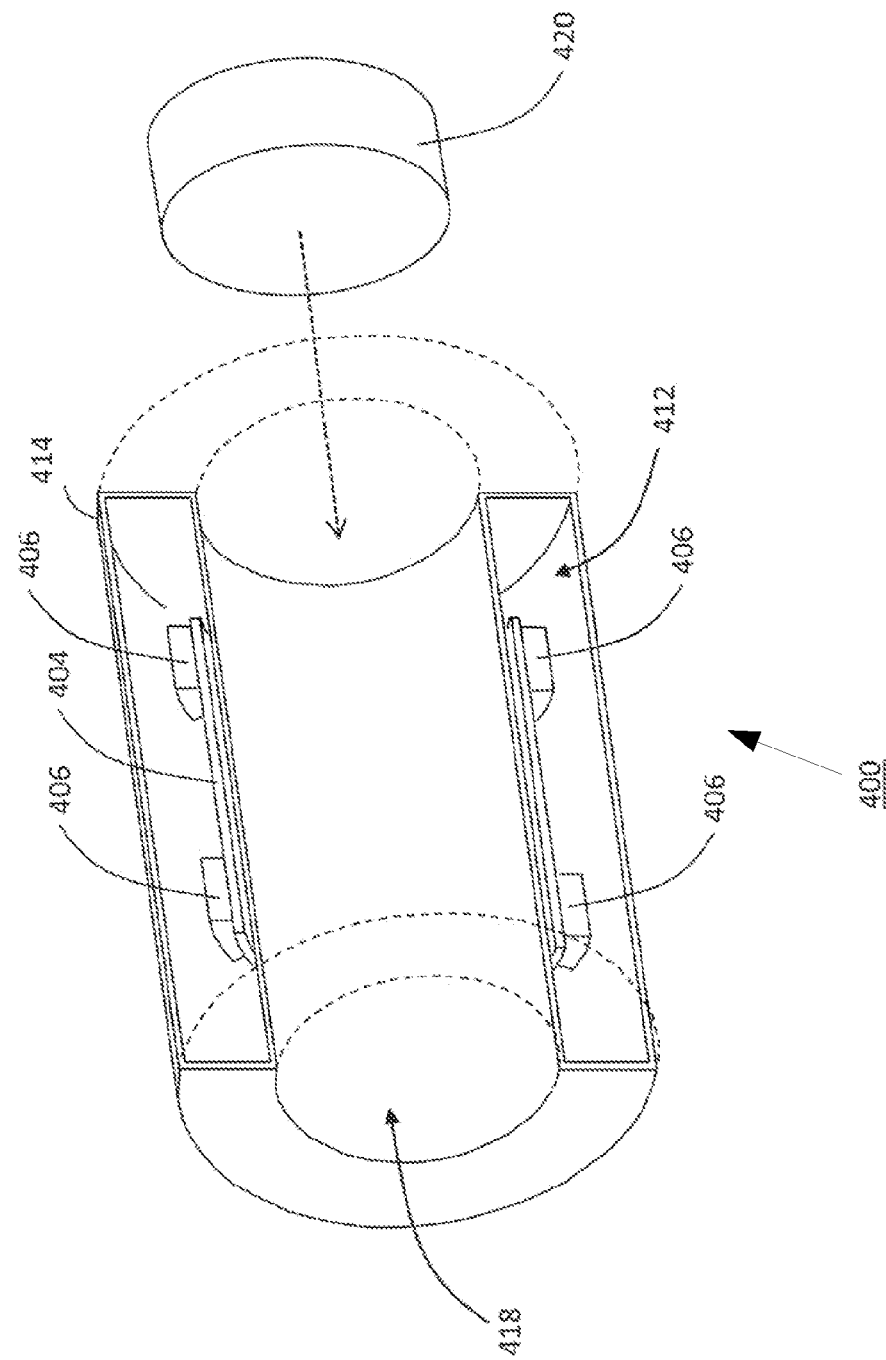
FIG. 4 shows an exemplary construction for a sound-reducing RF coil in accordance with an embodiment of the present disclosure.

FIG. 4 shows a preferred embodiment of the present invention. In this embodiment a quiet RF coil assembly 400 is shown. Quiet RF coil assembly 400 is comprised of an RF coil substrate 404 upon which RF coil components 406 are mounted. Examples of RF coil components 406 include the capacitors and inductive elements shown in FIGS. 2 and 3. RF coil substrate 404 can be constructed with fiberglass, plastic ceramic or any other MR-compatible material that is suitable for mounting RF coil components 406. Quiet RF coil assembly 400 is further comprised of an RF coil cavity 412 that is filled with a sound absorbing substance. In the preferred embodiment of the present invention, this sound absorbing substance is an open-cell foam such as foam rubber. In alternate embodiments, the sound absorbing substance can include putty, gel, cloth batting, sponge, or the like.

An aspect of the present invention is that there are no rigid components connecting the RF coil components to the outside of the assembly. This greatly reduces the propagation of sound vibrations from the gradient coils 112 to the inner bore of the RF coil and thus reduces the acoustic sound level experienced by the patient 110.

The sound absorbing material filling RF coil cavity 412 is contained within an RF coil shell 414. In one preferred embodiment of the present invention RF coil shell 414 is constructed with a flexible cloth-like material. This cloth-like material can be constructed of vinyl, plastic, or cloth. It can also have a complex construction such as rubberized cloth. RF coil shell 414 serves to encapsulate the RF coil substrate 404, the RF coil components 406 the RF coil cavity 412, and the sound absorbing material contained therein. RF coil shell 414 also serves to substantially align the RF coil substrate 404 within the quiet RF coil assembly 400. In FIG. 4 RF coil shell 414 is shown to entirely encapsulate the full assembly, including its inner bore 418. In alternate embodiments of the preferred invention, RF coil shell 414 can be truncated to allow the contents of RF coil cavity 412, to come in direct contact with the walls of the gradient coils 112.

In another embodiment of the present invention, an end cap 420 constructed with sound-absorbing material may be inserted at one end of the inner bore 418. If desired, end cap 420 can be constructed of the same sound absorbing material found in RF coil cavity 412 and use the same flexible cloth-like material used for RF coil shell 414.

In one embodiment of the present invention, the quiet RF coil assembly is permanently fixed in the MRI system's magnet. In another embodiment the coil is removable. A removable body coil may be useful in smaller magnets intended for orthopedic and/or neonatal applications where it is desirable to select an RF coil whose size is matched to the anatomy being imaged.

In the present invention, the electrical design of the RF coil is not intended to be limited. RF coil assemblies incorporating low-pass birdcage, high-pass birdcage, band-pass birdcage and TEM topologies are all within the scope of the invention. Likewise, RF coil assemblies that provide transmit-only transmit/receive and receive-only functionality are within the scope of the invention.

Figure 5:
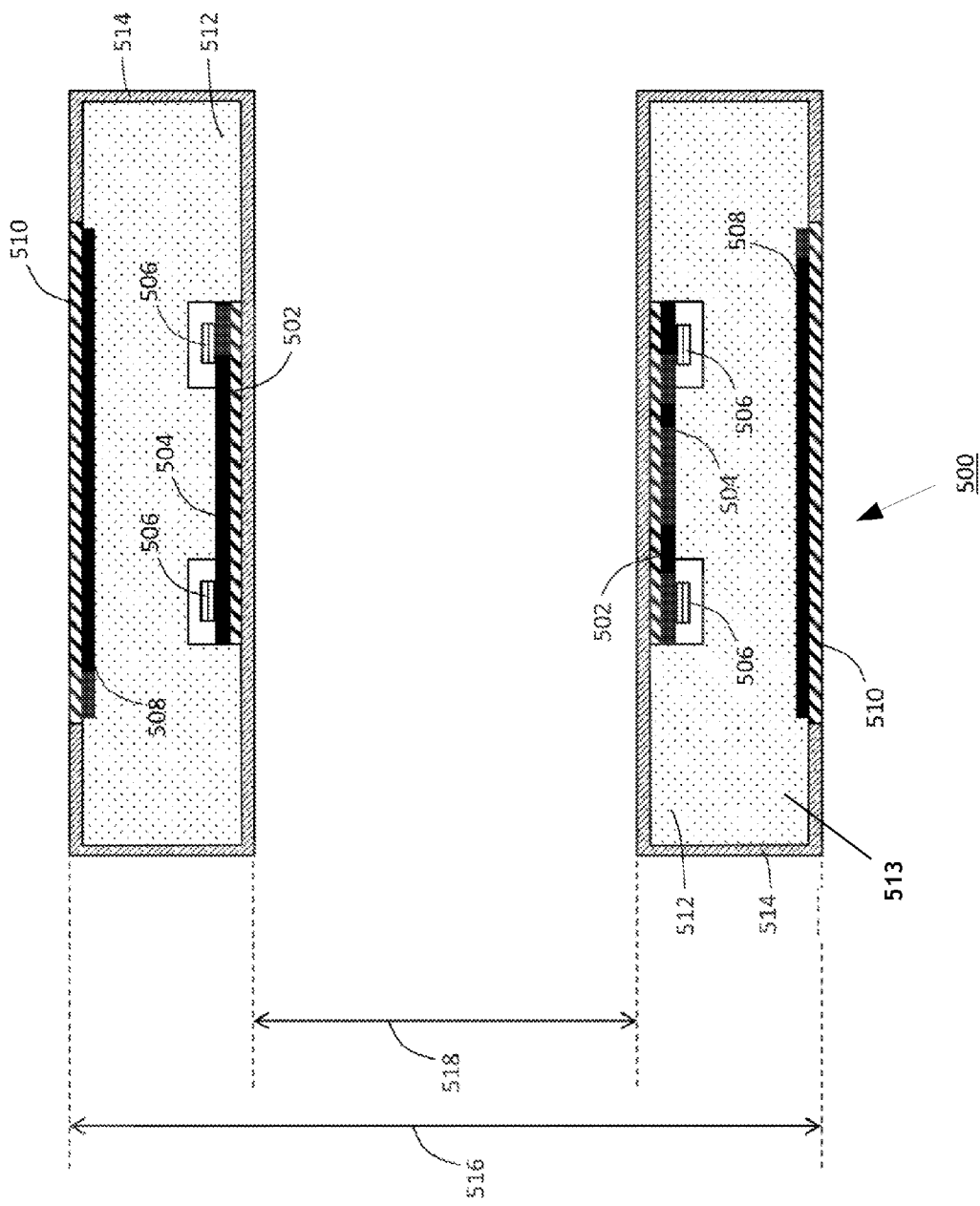
FIG. 5 shows a mid-line longitudinal cross section of a sound-reducing RF coil in accordance with an embodiment of the present disclosure.

FIG. 5 shows a preferred embodiment of the present invention in greater detail. In this embodiment, a longitudinal cross section of a quiet RF coil assembly 500 is shown. Quiet RF coil assembly 500 is comprised of an RF coil substrate 502 upon which RF coil components are mounted. Two such components are shown in FIG. 5: a birdcage rung 504 and birdcage capacitor 506. These components are shown in a configuration consistent with the high-pass birdcage coil design shown in FIG. 2, but it should be readily appreciated that alternate RF coil constructions such as low-pass birdcage, band-pass birdcage and TEM configurations are included in the spirit of the invention. RF coil substrate 502 can be constructed with fiberglass, plastic, ceramic or any other MR-compatible material that is suitable for mounting birdcage rung 504 and birdcage capacitor 506. Quiet RF coil assembly 500 is further comprised of an RF coil cavity 512 that is filled with a sound absorbing substance 513 (shown in FIG. 5 as an array of dots). In the preferred embodiment of the present invention this sound absorbing substance 513 is an open-cell foam such as foam rubber. In alternate embodiments, the sound absorbing substance can include putty gel, cloth batting, sponge, or the like. Note that if desired, air gaps can be left around selected components. Air gaps may prove useful for heat dissipation and/or to reduce the likelihood of voltage breakdown.

Quiet RF coil assembly 500 is further comprised of an RF shield 508 mounted on an RF shield substrate 510. RF shield 508 can be constructed with a conducting sheet of copper, a conducting mesh or a slotted conductor. RF shield substrate 510 can be constructed with a rigid material such as fiberglass, plastic, ceramic or the like.

The sound absorbing material 513 filling RF coil cavity 512 is contained within an RF coil shell 514. In one preferred embodiment of the present invention RF coil shell 514 is constructed with a flexible cloth-like material. This cloth-like material can be constructed of vinyl, plastic, or cloth. It can also have a complex construction such as rubberized cloth. RF coil shell 514 serves to encapsulate the RF coil substrate 502, the birdcage rungs 504, the birdcage capacitors 506 the RF coil cavity 512 and the sound absorbing material contained therein. RF coil shell 514 and the sound absorbing material contained in RF coil cavity 512 also serve to substantially align RF coil substrate 502 within the quiet RF coil assembly 500. In FIG. 5 RF coil shell 514 is shown to entirely encapsulate the assembly, including surfaces at the inner bore diameter 518 and outer bore diameter 516. In alternate embodiments of the preferred invention, RF coil shell 514 can be truncated to allow the RF shield substrate 510 to come in direct contact with the walls of the gradient coils 112.

Figure 6:
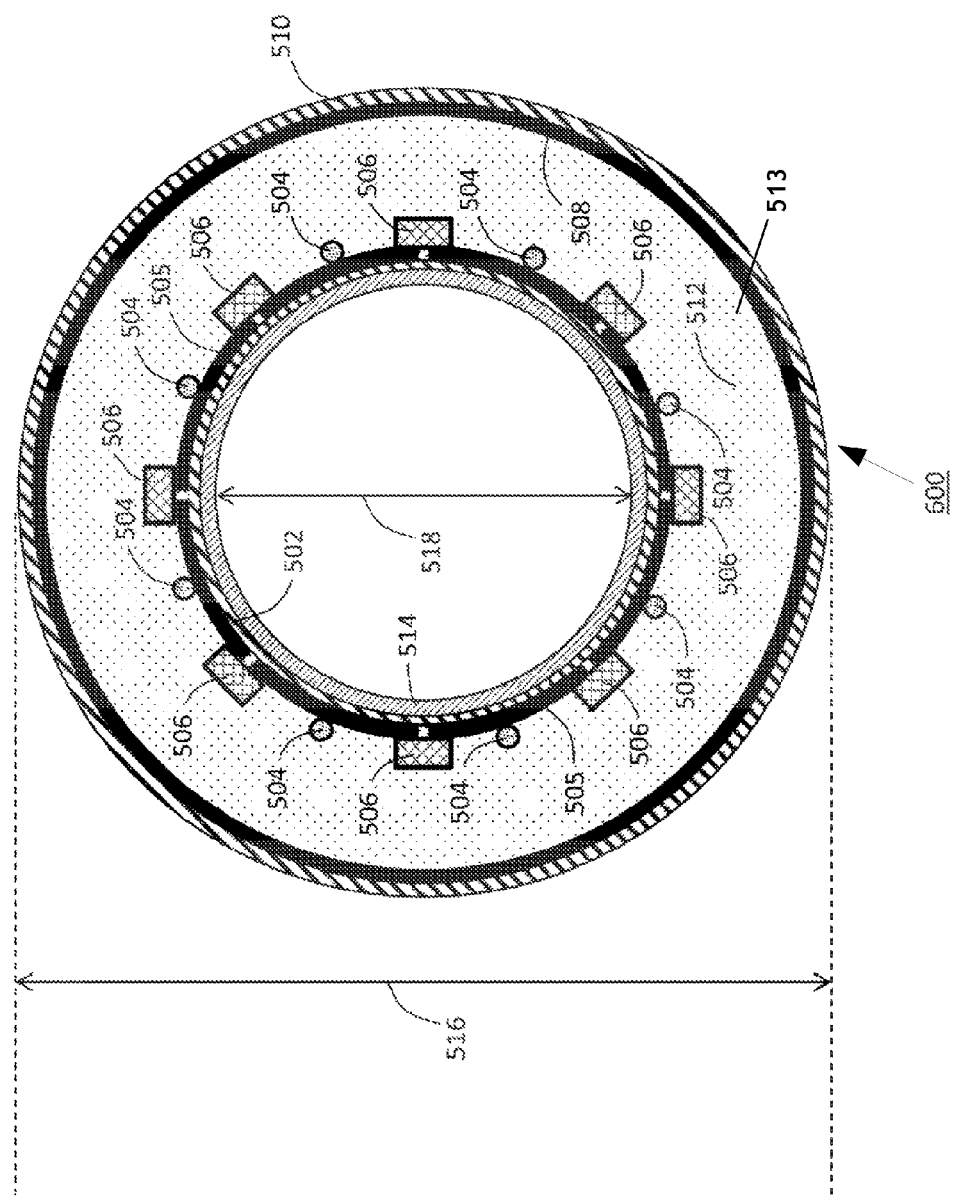
FIG. 6 shows a radial cross section of a sound-reducing RF coil in accordance with embodiment of the present disclosure.

FIG. 6 shows another preferred embodiment of the present invention in greater detail. In this embodiment, a radial cross section of a quiet RF coil assembly 600 is shown. This radial cross section shows one of the end rings of a high-pass birdcage coil. Quiet RF coil assembly 600 is comprised of an RF coil substrate 502 upon which RF coil components are mounted. Three such components are shown in FIG. 6: a set of eight birdcage rungs 504, a set of eight birdcage capacitors 506 and a birdcage circuit board 505. These components are shown in a configuration consistent with the high-pass birdcage coil design shown in FIG. 2, but it should be readily appreciated that alternate RF coil constructions are included in the spirit of the invention. RF coil substrate 502 can be constructed with fiberglass, plastic, ceramic or any other MR-compatible material that is suitable for mounting birdcage rungs 504, birdcage capacitors 506 and circuit board 505. Quiet RF coil assembly 600 is further comprised of an RF coil cavity 512 that is filled with a sound absorbing substance 513 (shown in FIG. 6 as an array of dots). In the preferred embodiment of the present invention, this sound absorbing substance 513 is an open-cell foam such as foam rubber. In alternate embodiments, the sound absorbing substance can include putty, gel cloth batting, sponge, or the like. Note that if desired, air gaps can be left around selected components. Such gaps may prove useful for heat dissipation and/or to reduce the likelihood of voltage breakdown.

Quiet RF coil assembly 600 is further comprised of an RF shield 508 mounted on an RF shield substrate 510. RF shield 508 can be constructed with a conducting sheet of copper a conducting mesh or a slotted conductor. RF shield substrate 510 can be constructed with a rigid material such as fiberglass, plastic, ceramic or the like.

The sound absorbing material filling RF coil cavity 512 is contained within an RF coil shell 514. In one preferred embodiment of the present invention RF coil shell 514 is constructed with a flexible cloth-like material. This cloth-like material can be constructed of vinyl, plastic, or cloth. It can also have a complex construction such as rubberized cloth. RF coil shell 514 serves to encapsulate the RF coil substrate 502, the birdcage rungs 504, the circuit board 505, the RF coil cavity 512, and the sound absorbing material contained therein. RF coil shell 514 and the sound absorbing material contained in RF coil cavity 512 also serve to substantially align RF coil substrate 502 within the quiet RF coil assembly 600. In FIG. 6 RF coil shell 514 is shown only on the surface of the inner bore diameter 518. In alternate embodiments of the preferred invention. RF coil shell 514 can be extended to the exterior of the assembly to prevent RF shield substrate 510 from coming in direct contact with the walls of the gradient coils 112.

Figure 7:
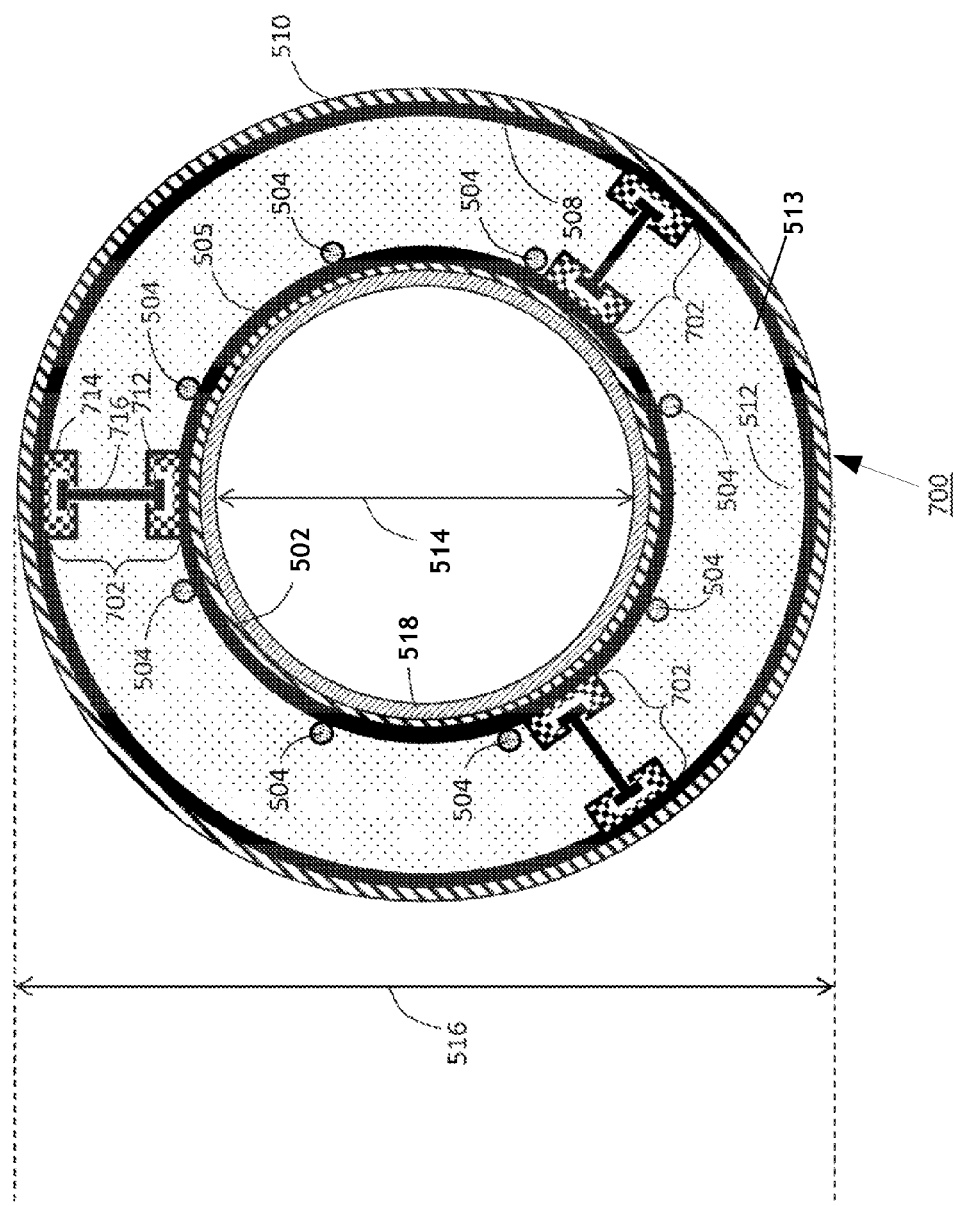
FIG. 7 shows a radial cross section of a sound-reducing RF coil of an alternate embodiment of the present disclosure, in which suspension elements are employed.

FIG. 7 shows another preferred embodiment of the present invention in greater detail. In this embodiment, a radial cross section of a quiet RF coil assembly 700 is shown. This radial cross section shows one of the end rings of a low-pass birdcage coil. Quiet RF coil assembly 700 is comprised of an RF coil substrate 502 upon which RF coil components are mounted. Two such components are shown in FIG. 7: a set of eight birdcage rungs 504 and a birdcage circuit board 505. These components are shown in a configuration consistent with the low-pass birdcage coil design shown in FIG. 3, but it should be readily appreciated that alternate RF coil constructions are included in the spirit of the invention. Quiet RF coil assembly 700 is further comprised of an RF coil cavity 512 that is filled with a sound absorbing substance 513 (shown in FIG. 7 as an array of dots). Note that if desired, air gaps can be left around selected components.

Quiet RF coil assembly 700 is further comprised of an RF shield 508 mounted on an RF shield substrate 510. The sound absorbing material filling RF coil cavity 512 is contained within an RF coil shell 514. In one preferred embodiment of the present invention RF coil shell 514 is constructed with a flexible cloth-like material. RF coil shell 514 serves to encapsulate the RF coil substrate 502, the birdcage rungs 504, the circuit board 505, the RF coil cavity 512, and the sound absorbing material contained therein. RF coil shell 514 and the sound absorbing material contained in RF coil cavity 512 also serve to substantially align RF coil substrate 502 within the quiet RF coil assembly 700. In FIG. 7 RF coil shell 514 is shown only on the surface of the inner bore diameter 518. In alternate embodiments of the preferred invention. RF coil shell 514 can be extended to the exterior of the assembly to prevent RF shield substrate 510 from coming in direct contact with the walls of the gradient coils 112.

Quiet RF coil assembly 700 is further comprised of at least one coil suspension assembly 702 which provides a physical support for RF coil substrate 502 with respect to RF shield substrate 510. In FIG. 7 three coil suspension assemblies 702 are shown but within the spirit of the invention there can be more or fewer suspension assemblies. Each suspension assembly 702 is comprised of a coil suspension mount 712, a shield suspension mount 714 and a suspension member 716. The elements of the suspension assembly 702 are designed to provide physical support for the RF coil while substantially minimizing the propagation of vibrations from the gradient coils into the central bore of the quiet RF coil assembly 700.

While the foregoing disclosure includes many details and specificities, it is to be understood that these have been included for purposes of explanation and example only, and are not to be interpreted as limitations of the inventions described herein. It will be apparent to those skilled in the art that other modifications to the embodiments described above can be made without departing from the spirit and scope of the inventions as claimed. Accordingly, such modifications are to be considered within the scope of such inventions. Likewise, it is to be understood that it is not necessary to meet any or all of the identified advantages or objects of any of the inventions described herein in order to fall within the scope of the claims, since inherent and/or unforeseen advantages of such inventions may exist even though they may not have been explicitly discussed herein.

All publications, articles, patents and patent applications cited herein are incorporated into the present disclosure by reference to the same extent as if each individual publication, article patent application, or patent was specifically and individually indicated to be incorporated by reference.

What is claimed is:

1. An MRI scanner comprising:
an MRI magnet assembly including a magnet housing providing an axial bore and containing a cylindrical magnet therewithin such that the cylindrical magnet is coaxially positioned with respect to the axial bore, the cylindrical magnet being equipped to generate a substantially homogeneous magnetic field within an imaging region of the axial bore; and
a Radio Frequency (RF) coil assembly coaxially mounted to the MRI magnet assembly within the axial bore and surrounding the imaging region using only non-rigid connecting components, the RF coil assembly including a non-rigid sound absorbing substrate and an electrical coil sub-assembly comprised of inductive and capacitive elements, wherein said sub-assembly is supported by the non-rigid substrate.

2. The MRI scanner of claim 1, wherein the non-rigid sound absorbing substrate is composed of, at least in part, open cell foam.

3. The MRI scanner of claim 1, wherein the electrical coil sub-assembly has at least one of a low-pass birdcage coil topology, a high-pass birdcage coil topology, a band-pass coil topology and a Transverse ElectroMagnetic (TEM) coil topology.

4. The MRI scanner of claim 1, the RF coil assembly further includes an RF shield coaxially surrounding the electrical coil sub-assembly.

5. The MRI scanner of claim 4, wherein the RF coil assembly further includes a suspension assembly radially extending between the non-rigid sound absorbing substrate and the RF shield.

6. The MRI scanner of claim 4, wherein the RF shield is composed of at least one of an electrically conducting sheet, a slotted electrically conducting sheet and an electrically conducting mesh.

7. The MRI scanner of claim 1, wherein the non-rigid sound absorbing substrate and electrical coil sub-assembly are encapsulated, at least in part, with a cloth-like material.

8. The MRI scanner of claim 7 wherein the cloth-like material further encapsulates a sound-absorbing filler material surrounding at least portions of the electrical coil sub-assembly.

9. The MRI scanner of claim 7, wherein the cloth-like material is made from at least one of vinyl, plastic, cloth and a compound construction combining a plurality of materials.

10. The MRI scanner of claim 1, wherein the RF coil assembly is permanently mounted to the MRI magnet assembly.

11. The MRI scanner of claim 1, wherein the RF coil assembly removably mounted to the MRI magnet assembly.

12. The MRI scanner of claim 1, wherein the RF coil sub-assembly is used for at least one of, transmit-only functions, transmit and receive functions and receive-only functions.

13. The MRI scanner of claim 1, wherein the RF coil assembly includes a foam end-cap on an axial end thereof.

14. The MRI scanner of claim 1, wherein the RF coil assembly includes a cylindrical shell enclosing the non-rigid sound absorbing substrate and the electrical coil sub-assembly.

15. The MRI scanner of claim 14, wherein the cylindrical shell is constructed with a flexible cloth-like material.

16. The MRI scanner of claim 14, wherein the cylindrical shell is constructed at least with an outer cylindrical RF shield and an inner cylindrical flexible cloth-like material.

17. The MRI scanner of claim 14, wherein the RF coil assembly further includes a suspension assembly radially extending between inner and outer cylindrical walls of the cylindrical shell.

18. The MRI scanner of claim 14, wherein the cylindrical shell is filled with a sound-absorbing filler material.

19. The MRI scanner of claim 18, wherein the sound-absorbing filler material is at least one of an open-cell foam material, a putty, a gel, cloth batting, and sponge material.

20. The MRI scanner of claim 19, wherein the RF coil assembly includes air gaps between the electrical coil sub-assembly and the sound absorbing filler material.

21. An MRI scanner comprising:
an MRI magnet assembly including a magnet housing providing an axial bore and containing a cylindrical magnet therewithin such that the cylindrical magnet is coaxially positioned with respect to the axial bore, the cylindrical magnet being equipped to generate a substantially homogeneous magnetic field within an imaging region of the axial bore; and a Radio Frequency (RF) coil assembly coaxially mounted to the MRI magnet assembly within the axial bore and surrounding the imaging region, the RF coil assembly including, (a) a coil sub-assembly substrate, (b) an electrical coil sub-assembly comprised of inductive and capacitive elements, wherein said coil sub-assembly is supported by the coil sub-assembly substrate, (c) a shell enclosing the coil sub-assembly substrate and the electrical coil sub-assembly, wherein the shell is a cylindrical shell constructed from a flexible cloth-like material, and (d) a sound-absorbing filler material filling the shell and surrounding the electrical coil sub-assembly.

22. The MRI scanner of claim 21, wherein the coil sub-assembly substrate is formed from a non-rigid material.

23. The MRI scanner of claim 22, wherein the non-rigid material includes open-cell foam.

24. The MRI scanner of claim 21, wherein the shell is constructed at least with an outer cylindrical RF shield and an inner cylindrical flexible cloth-like material.

25. The MRI scanner of claim 21, wherein the sound-absorbing filler material includes at least one an open-cell foam material, a putty, a gel, cloth batting, and sponge material.

* * * * *